US010776192B2

(12) United States Patent
Lillibridge et al.

(10) Patent No.: US 10,776,192 B2
(45) Date of Patent: Sep. 15, 2020

(54) MEMORY STORE ERROR CHECK (71) Applicant: Hewlett Packard Enterprise Development LP, Houston, TX (US)

(72) Inventors: Mark Lillibridge, Mountain View, CA (US); John L. Byrne, Pasadena, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 155 days.

(21) Appl. No.: 15/756,956

(22) PCT Filed: Sep. 17, 2015

(86) PCT No.: PCT/US2015/050732
§ 371 (c)(1),
(2) Date: Mar. 1, 2018

(87) PCT Pub. No.: WO2017/048261
PCT Pub. Date: Mar. 23, 2017

(65) Prior Publication Data
US 2018/0276062 A1  Sep. 27, 2018

(51) Int. Cl.
*G06F 11/07* (2006.01)
*G11C 29/02* (2006.01)
*G11C 29/44* (2006.01)
*G06F 12/10* (2016.01)

(52) U.S. Cl.
CPC .......... *G06F 11/076* (2013.01); *G06F 11/073* (2013.01); *G06F 11/0784* (2013.01); *G06F 12/10* (2013.01); *G11C 29/022* (2013.01); *G11C 29/44* (2013.01); *G06F 2212/1032* (2013.01); *G06F 2212/657* (2013.01)

(58) Field of Classification Search
CPC ...... G06F 11/076; G06F 11/073; G06F 12/10; G11C 29/022; G11C 29/44
See application file for complete search history.

(56) References Cited

U.S. PATENT DOCUMENTS

| 5,233,610 | A |   | 8/1993 | Nakayama et al. |
| 6,098,179 | A | * | 8/2000 | Harter, Jr. ................ H04L 1/24 714/18 |
| 6,993,690 | B1 |   | 1/2006 | Okamoto |
| 7,539,905 | B2 |   | 5/2009 | Kay |

(Continued)

FOREIGN PATENT DOCUMENTS

EP     2063428     5/2009

OTHER PUBLICATIONS

International Searching Authority, The Internationals Search Report and the Written Opinion, dated Jun. 17, 2016, 11 Pages.

(Continued)

*Primary Examiner* — Paul Contino
(74) *Attorney, Agent, or Firm* — Hewlett Packard Enterprise Patent Department (57) ABSTRACT

Techniques for memory store error checks are provided. In one aspect, a process running on a processor may execute an instruction to store a first value in memory. The processor may store a plurality of values, including the first value, from a plurality of processes to the memory. A check on a synchronous error notification path may be performed to determine whether an error in storing at least one of the plurality of values occurred.

15 Claims, 5 Drawing Sheets

(56) References Cited

U.S. PATENT DOCUMENTS

| | | | |
|---|---|---|---|
| 9,032,261 B2* | 5/2015 | Chan | G06F 11/073 |
| | | | 714/706 |
| 2005/0281112 A1 | 12/2005 | Ito et al. | |
| 2006/0026489 A1 | 2/2006 | Noda et al. | |
| 2006/0075285 A1 | 4/2006 | Madukkarumukumana et al. | |
| 2006/0236208 A1 | 10/2006 | Suzuki et al. | |
| 2007/0098163 A1 | 5/2007 | Macri et al. | |
| 2008/0288809 A1 | 11/2008 | Koguchi et al. | |
| 2009/0177932 A1 | 7/2009 | Abts et al. | |
| 2013/0124931 A1 | 5/2013 | Chen | |
| 2013/0151912 A1 | 6/2013 | Sevugapandian | |
| 2014/0317479 A1 | 10/2014 | Candelaria | |
| 2014/0325294 A1* | 10/2014 | Chan | G06F 11/076 |
| | | | 714/708 |
| 2015/0317338 A1* | 11/2015 | Radovic | G06F 9/30043 |
| | | | 707/695 |
| 2016/0224412 A1* | 8/2016 | Healy | G06F 11/1008 |
| 2018/0276062 A1* | 9/2018 | Lillibridge | G06F 11/076 |

OTHER PUBLICATIONS

Sazeides, Y, et al., CBFD: a Count-based, Fault Detection Scheme for Memory Arrays, (Research Paper), Mar. 23, 2011, 6 Pages.

* cited by examiner

MEMORY STORE ERROR CHECK

BACKGROUND

Computing systems today may include block-based persistent storage devices. For example, systems may include disk-based or flash-based storage devices. Generally, writing data to such devices involves the use of the computers Input/Output (I/O) system. Under some circumstances, there may be errors when writing data to a persistent block device using the I/O system.

Systems may assume that errors in the I/O system may occur and software running on those systems may be designed to receive indications of an error in writing data through the I/O system. The software may then take immediate corrective action.

DETAILED DESCRIPTION

Computing system architectures are being developed in which persistent block based storage is being partially or completely replaced with byte-addressable non-volatile random access memory (NVRAM). Some examples of such memory may include memristor memories, phase change RAM (PCRAM), spin torque transfer (STT) RAM, and others. Other systems may still make use of volatile memory, such as static RAM (SRAM) or dynamic RAM (DRAM), as well as other types of volatile memory. The memory store error check techniques described herein are applicable to both volatile and non-volatile memories. The remainder of the disclosure will refer to memory generally, but it should be understood that memory refers to both volatile and non-volatile memory, and is not limited to any particular type of memory.

Just as with I/O errors, errors may also occur when writing to memory. However, the current handling of such errors can be problematic. For example, in one write error handling technique, when an error in writing a value to a memory location occurs, a special value, often referred to as poison, is written to the memory location instead. Upon a subsequent read of that memory location, the poison value is detected and corrective action may be taken (if possible).

In another example of a memory write error handling technique, a process may cause a processor to execute an instruction to store a value in memory. The processor may then issue the store command to a memory controller to actually execute the storage of the value in memory. The process may then continue execution, even though the memory controller may not yet have written the value to the memory. If an error in writing occurs, the process may be notified via some type of interrupt (e.g., a signal generated by the operating system (OS)). However, the timing of the signal may be asynchronous, such that the process does not know when to anticipate the receipt of such a signal. Because the process does not know if or when such a signal may be received (e.g., the error free case), the process cannot be designed to efficiently take corrective action in those cases where the signal is received.

The error handling techniques described above exhibit problems in that there may be a delay from when an error occurs to when the process is made aware of the error. Because of the delay, the process may not be able to take corrective action. For example, in the case where poison is used, the process is not made aware of the error until the value written is actually read. In the case of a notification via an interrupt, the process may have already moved on to different tasks. In both cases, the process may not be able to take appropriate corrective action because of the delay in notification.

The techniques described herein provide for memory store error checks that notify a process of an error in a timely fashion, such that the process may take corrective action. A process may first read a current value of an error count that is being maintained by a memory controller. The process may then write a value to the memory. The process may then again check the value of the error counter. A difference in value of the error count indicates an error occurred in writing to the memory.

The memory controller may be used by all processes running on the computing system. Although the error counter allows the process to determine that an error occurred, this does not mean that the error that occurred was associated with the process. When the process determines an error has occurred, the process may then wait to see if the OS signals the process that the error may have been caused by the process's attempt to write to memory. If so, the process may take the appropriate corrective action. If the error was not associated with the process, the process can continue operation.

Appropriate error correction may be process dependent. For example, corrective action may include attempting to write the data again. As another example, a process may mirror data between two sections of memory. An error in writing to one of the sections may cause the process to declare that particular mirror invalid, and cause the mirror to be rebuilt elsewhere in memory. The techniques described herein are not limited to any particular type of error correction. It should be understood that the techniques described herein provide the ability for a process to be notified of an error at a time when the processor can take appropriate corrective action and are not limited to any particular type of corrective action.

Figure 1:
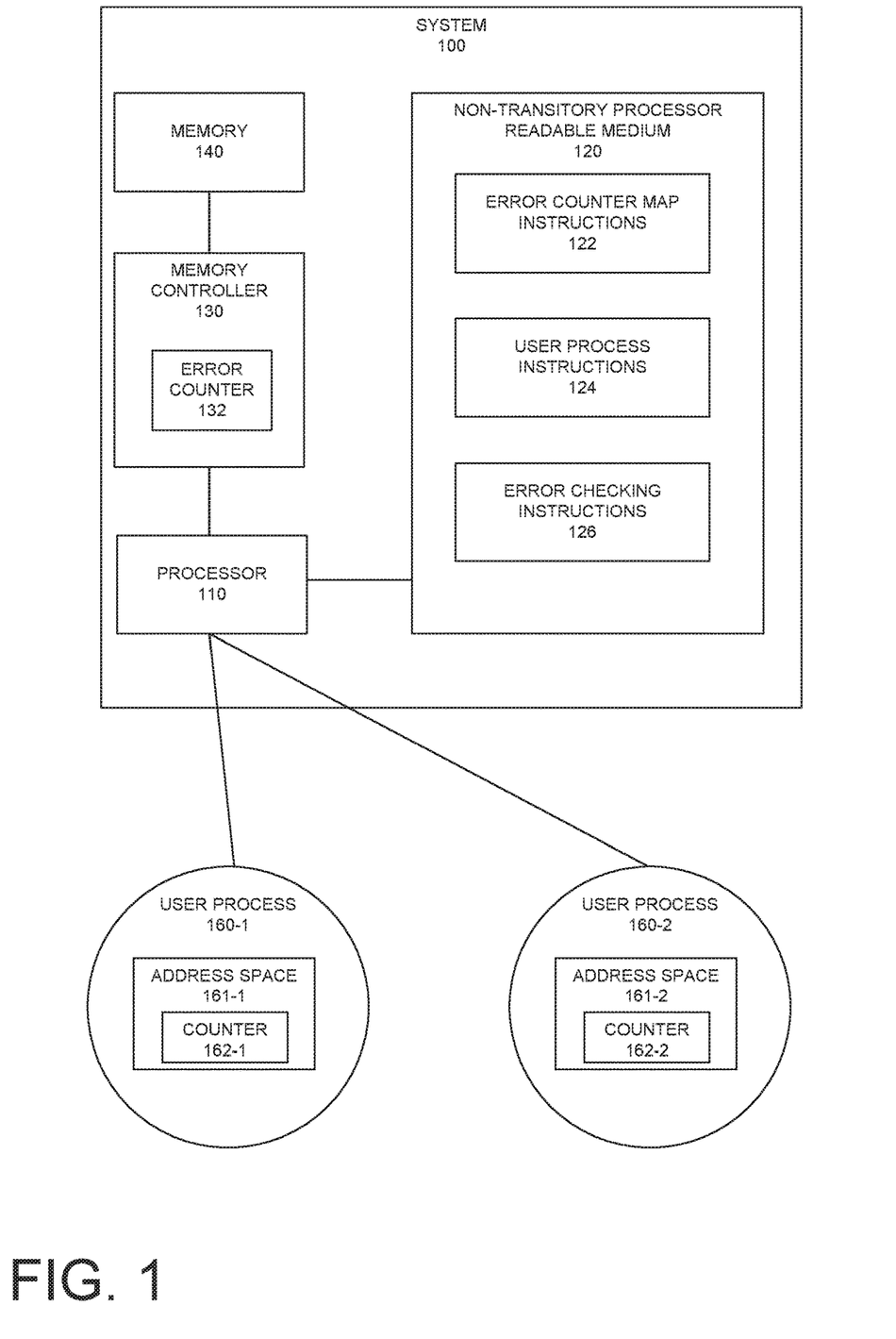
FIG. 1 is an example of a system that may utilize the memory store error check techniques described herein.

FIG. 1 is an example of a system that may utilize the memory store error check techniques described herein. System 100 may be any type computing system and is not limited to a particular form. Example computing systems may include servers, laptops, desktops, mobile devices, or any suitable system. In general, system 100 may include a processor 110, a memory controller 130, a memory 140, and a non-transitory processor readable medium 120.

The processor 110 may be any device capable of executing instructions, such as a central processing unit (CPU), graphics processing unit (GPU), application specific integrated circuit (ASIC), or any other suitable device. The techniques describe herein are not limited to any particular type of processor. The processor may be coupled to a non-transitory processor readable medium 120. The medium may contain thereon a set of instructions, which when executed by the processor may cause the processor to implement the techniques described herein. Although only a single processor is shown, it should be understood that system 100 may contain multiple processors 110.

For example, the medium 120 may include error counter map instructions 122. The error counter map instructions may allow a processor to map an error counter into a processes' address space, such that the process may access the value of the error counter. Operation of the error counter is described in further detail below. The medium may also include user process instructions 124. The user process instructions may be instructions executed by the processor to implement a user process. A user process may be a user program or a thread of a user program. In general, a user process is a program running on a system 100 to execute some piece of desired functionality.

Medium 120 may also include error checking instructions 126. Error checking instructions are described in more detail below and with respect to the flow diagrams depicted in FIGS. 5 and 6. Error checking instructions may allow a process to write a value to a memory and determine if an error occurred in writing a value to memory (not necessarily the value being written by the process). If an error occurred, the error checking instructions may further be used to determine the process/processes impacted by the error, and those processes may be notified of the error.

System 100 may also include a memory controller 130. Although depicted as a separate element from processor 110, in some implementations, the memory controller may be integrated within the processor. The memory controller may be responsible for reading values from and writing values to memory 140. The processor 110 may command the memory controller to read data from or write data to a particular location (i.e. address) in the memory. The memory controller may be responsible for interfacing with the physical memory to execute the processors commands for reading/writing to the memory.

The memory controller may also include an error counter 132. The error counter may be used to count the number of errors that have occurred writing to the memory 140. In other words, upon detection of an error in writing to memory, the error counter may be altered (e.g., incremented or decremented). As will be described later, the error counter may be examined to determine whether an error writing values to memory has occurred. In some implementations, the error counter may be implemented as a hardware register.

The memory 140 may be of any suitable type. Some types of memory, such as memristor or DRAM have been mentioned above. The memory may be packaged in any suitable form. For example, the memory may be included in at least one dual in-line memory module (DIMM). The memory may be in other suitable form factors as well and the techniques described herein are not dependent on any particular memory form factor.

In operation, the processor 110 may execute user process instructions 124 to create and execute user processes. Two user processes 160-1,2 are shown in FIG. 1, however it should be understood that the techniques described herein are not limited to any number of user processes. Furthermore, the user processes need not all be of the same type. For example, one user process may be a database, while another is a web server. Any other types of processes are also possible. The techniques described herein are independent of the particular types of processes that are running.

Each user process may have an address space 161-1,2. The address space of the process may include data such as the process's executable code, data, text, stack space, and heap. The processor 110, using the error counter map instructions 122 may map the error counter 132 value into the processes address space 162-1,2. For example, the error counter map instructions may be a portion of the operating system that maps the hardware error counter register into the address space to make reading the error count more efficient. In other words, the value of the error counter 132 may be mapped into the process's address space, such that the process executable code may read the value of the counter just as if it were being read from any other value in the process's address space. Explained yet another way, the hardware register maintaining the error counter 132 may be mapped into the user process address space such that the user process can read the error counter while still in user mode (as opposed to kernel mode). As such, reading the error count by the process does not require a system call to enter kernel mode and can be implemented with minimal overhead.

The process 160-1 may desire to write a value to a location (e.g., address) in memory. The process may first read the error count 162-1 to determine the current value of the error counter. The process may then execute a store instruction in order to cause the processor to store the value in the memory. The processor may send the value to be stored (including the address) to the memory controller to be stored in the memory. Although a store is described in terms of a single instruction, it should be understood that multiple processor instructions may actually be executed to effectuate the store. For example, a first instruction may be used to store a value to a processor cache, then a second instruction may be executed to flush the value from the cache to the memory. For purposes of this disclosure storing a value is meant to encompass the value being stored in memory, regardless of the specific number of processor instructions used.

The memory controller may receive the store that originated from process 160-1. However, the memory controller may also be receiving stores from any number of other processes, such as process 160-2. The memory controller generally does not concern itself with the specific process that has requested values to be stored in memory, as the process generating the store request is generally unimportant to the memory controller. If an error occurs when storing a value, regardless of the source of the request to store the value, the memory controller may alter the error count. For example, in one implementation, the error counter may be incremented.

After the process 160-1 has executed the store instruction, the process may then read the error count again. The process may then compare the current value of the error count with the value read prior to executing the store instruction. If the values are different, then the memory controller experienced an error in storing a value to the memory. It should be noted that the values being different merely indicates that an error in storing a value occurred in the memory controller. It does not specify the process for which the error occurred. In other words, even though process 160-1 becomes aware of an error by reading the current value of the error count, the process does not know if its own store command is the one that experienced the error (e.g., it could have been a write from process 160-2 that experienced the error).

The detection of an error via the error counter may be referred to as checking a synchronous error path. Because the process executes the store command and then waits for the command to complete before checking the error count, the process is made aware of a possible error at approximately the same time as the store command was executed, hence the check is substantially synchronous with the store command's execution.

Once the process has determined that an error has potentially occurred based on a difference in the error count, the process may then move to an asynchronous error notification path. In the asynchronous error notification path, the process may wait for an indication that the memory error was due to the memory store executed by the process, as opposed to an error that occurred from a store performed by a different process.

Once an error occurs, the error checking instructions may execute on the processor to determine the process or processes that may be impacted by the error. For example, the error checking instructions may be implemented as part of the OS. The OS may obtain from the memory controller the physical address of the memory that was the cause of the error. The OS may then use this physical address to determine a process that had the physical address causing the error mapped into its address space. The determined process may then receive a signal indicating that the change in error count was related to the write from the process.

In some cases, a plurality of errors may occur very close in time to one another. For example, if a plurality of writes are all directed to a single DIMM, and the DIMM should fail, all of the writes would fail as well. As such, in some cases, the OS may obtain an indication of a failing or failed component, and the OS may signal all process that may have attempted to write to that device.

In some implementations, the memory controller may batch error notifications to the OS. For example, if an error occurs, the memory controller may include details related to the error (e.g., physical address, failing DIMM, address range) in a data structure and then trigger an interrupt to the processor. While the processor is handling the interrupt, additional errors may be occurring. The memory controller may batch these additional errors until processing of the initial interrupt has completed. The memory controller may then issue a new interrupt with the details of the errors that occurred since the previous interrupt.

The OS may keep track of the errors that have already been signaled to processes. For example, assume the error count is incremented by one upon each occurrence of an error. Also assume all errors have already been signaled to the processes, such that the error count and error signaled count are equal. When the first error occurs, the error count may be incremented by one. The error signaled count would remain at its current value until the error is actually signaled to the process. Once the error is signaled to the process, the error signaled count may be incremented, thus indicating that once again, all errors have already been signaled to their respective process. As explained below, the error signaled count may be used by a process to determine if a given error is associated with the process.

In some implementations, once the process becomes aware of a possible error through the synchronous path (e.g., when the value of the error count has changed after a store instruction), the process may enter an asynchronous error notification path. In the asynchronous path, the process may wait to receive a signal from the operating system indicating that the error is associated with the given process. However, it is possible that such a signal may never be received (e.g., the error was caused by a different process). The process may use the error signaled count to determine if the error has already been signaled. For example if the error count was initially x and after the process executes a store the error count was x+1, the process is aware that an error occurred (although not necessarily generated by that process). The process may then wait in the asynchronous path until either the error signal is received or the error signaled count is x+1. If the error signal is received, the error was caused by this process. Otherwise, the error signaled count being incremented to x+1 indicates that the proper process has been signaled, thus the instant process need no longer wait for the possibility that it might receive an error signal.

In some examples, the OS may periodically check the error count in the background looking for changes. When it detects a change, it may enter the asynchronous path and signal one or more processes that an error has occurred. This may allow processes that do not bother to check the error count to still receive notifications that an error may have occurred with one of their writes; however, unlike with the synchronous path, they may receive the notification well after the point that the error can be handled gracefully. They thus may be said to have received the error notification asynchronously, whereas the processes checking the error count receive the error notification synchronously.

Figure 2:
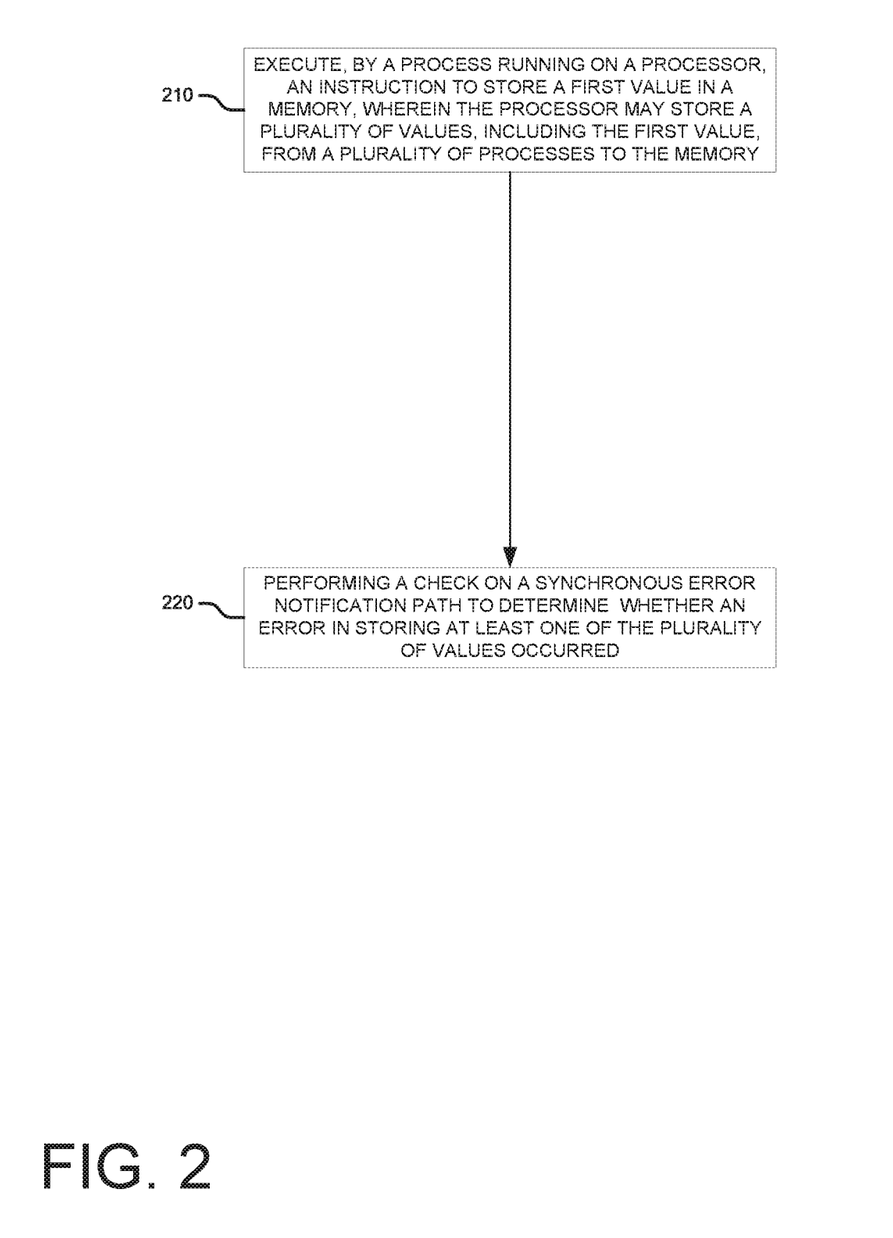
FIG. 2 is an example of a high level flow diagram for a process to check for write errors.

FIG. 2 is an example of a high level flow diagram for a process to check for write errors. In block 210, a process running on a processor may execute an instruction to store a first value in a memory. The processor may store a plurality of values, including the first value, from a plurality of processes to the memory. In other words, many processes may be running on a processor, each of those processes storing values to a memory. A specific process may be storing a specific value, referred to as the first value.

In block 220, a check on a synchronous error notification path may be performed to determine whether an error in storing at least one of the plurality of values occurred. In other words, the synchronous check may determine if an error occurred in writing any of the values to the memory. However, it should be understood that the error may not necessarily have occurred from the storing the first value, as it could have also occurred from storing any of the others of the plurality of values.

Figure 3:
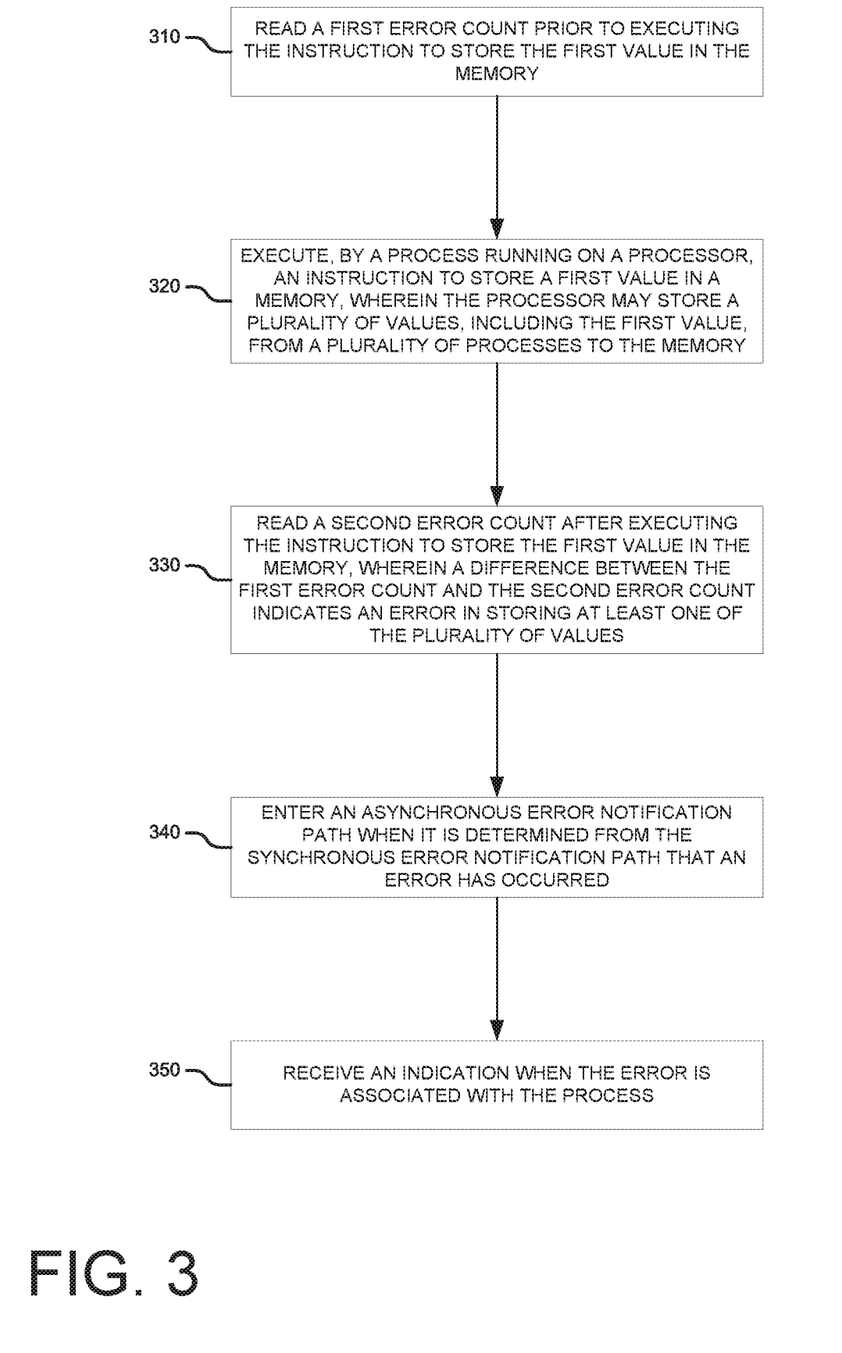
FIG. 3 is another example of a high level flow diagram for a process to check for write errors.

FIG. 3 is another example of a high level flow diagram for a process to check for write errors. In block 310, a first error count may be read prior to executing the instruction to store the first value in the memory. In other words, the process may first read the error count to determine what the error count was initially. In block 320, just as in block 210, the process may store a first value to the memory. This first value may be one of many values the processor is storing to the memory.

In block 330, a second error count may be read after executing the instruction to store the first value in the memory. A difference between the first error count and the second error count indicates an error in storing the at least one of the plurality of values. In other words, if the error counts are different, this means an error occurred in storing a value to memory sometime after the process read the first error count. The error may not necessarily be associated with the storing the first value. Put another way, a difference in the error counts indicates that at least one error has occurred between the reading of the first error count and the reading of the second error count. In some implementations, the error count may be maintained by a device, such as a memory controller. Both the first and second error counts may be read from the same device counter.

In block 340, an asynchronous error notification path may be entered when it is determined from the check on the synchronous error notification path that an error has occurred. In other words, if the error counts are different, indicating a possible error in storing the first value, the process may enter an asynchronous error notification path to determine if the error was associated with the process.

In block 350, an indication may be received when the error is associated with the process. Put another way, the synchronous error notification path informs the process that an error in storing the first value may possibly have occurred, while the asynchronous error notification path definitively notifies the process that the error was associated with storing the first value.

Figure 4:
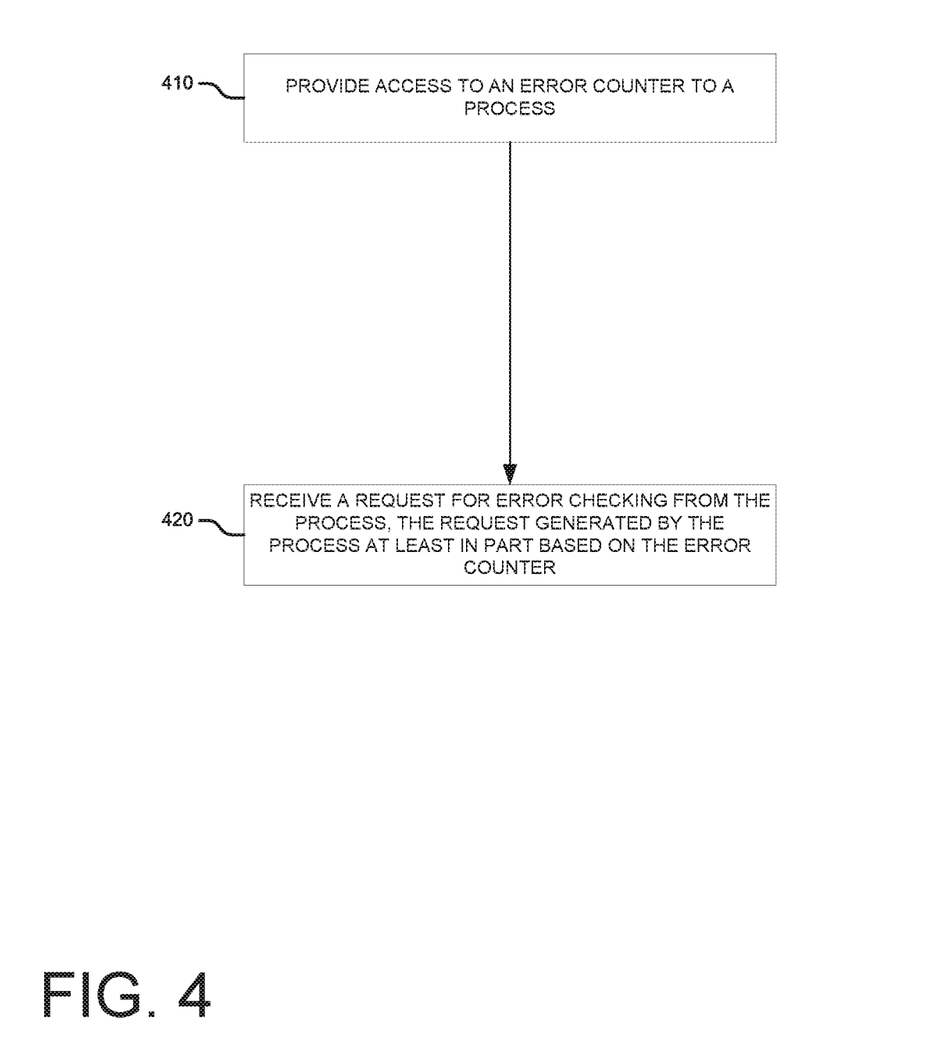
FIG. 4 is an example of a high live level flow diagram for providing the ability to check for write errors.

FIG. 4 is an example of a high live level flow diagram for providing the ability to check for write errors. In block 410, access to an error counter may be provided to a process. As described above, the memory controller may provide an error counter, and access to that error counter may be provided to a process. In block 420, a request for error checking may be received from the process. The request may be generated, at least in part, based on the error counter. In other words the process may request to determine if an error indicated by a change in the error counter could actually have been caused by that process.

Figure 5:
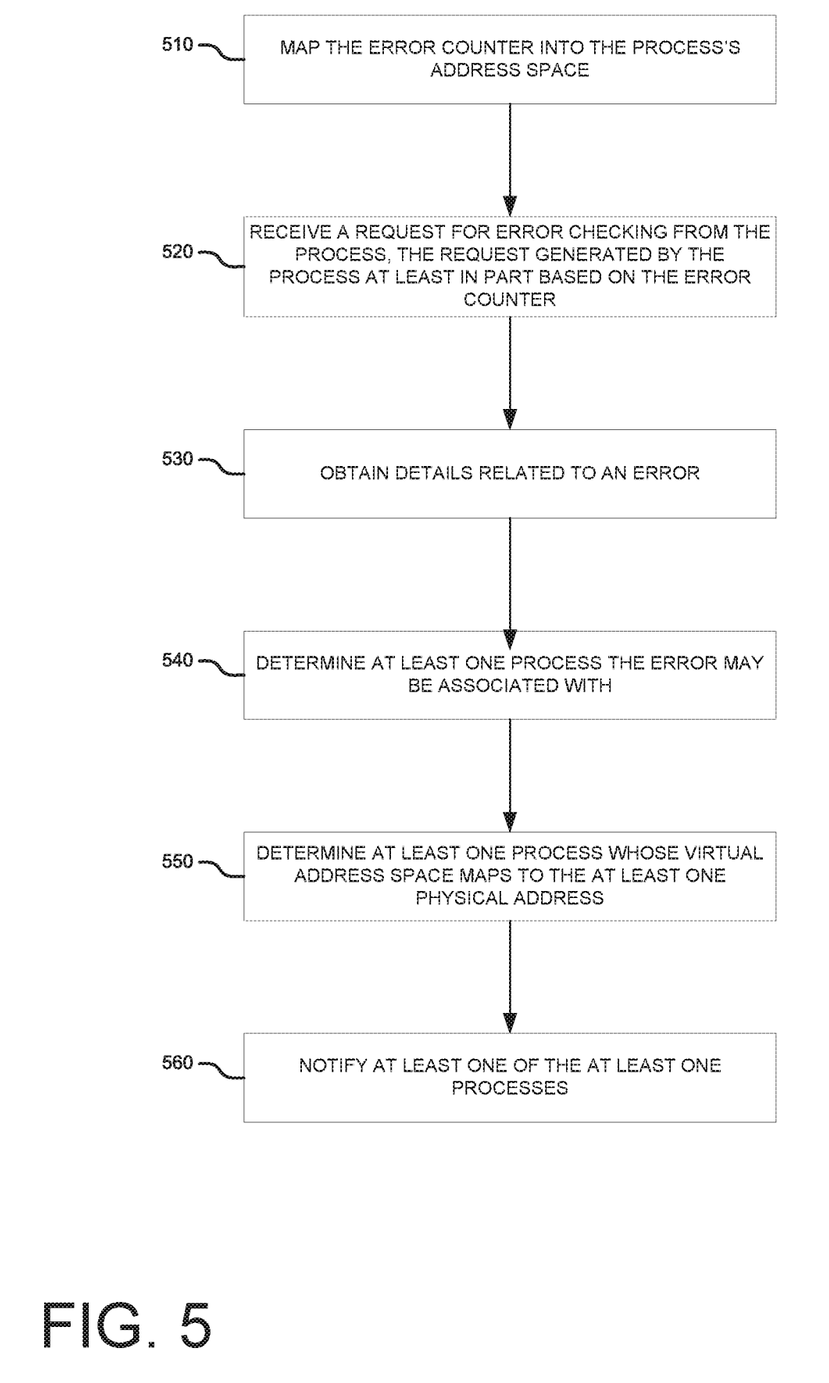
FIG. 5 is another example of a high level flow diagram for providing the ability to check of write errors.

FIG. 5 is another example of a high level flow diagram for providing the ability to check of write errors. In block 510, the error counter may be mapped into the process's address space. As mentioned above, the error counter may exist on a device, such as a memory controller. Reading the device by the processor normally may involve a system call, with corresponding overhead. By mapping the error counter into the process's address space, the process may read the error counter just as if it were reading any other variable within the address space. In other words, the value of the error counter is made available in the process's user space.

In block 520, just as in block 420, a request for error checking may be received form the process. In block 530, details related to an error may be obtained. As mentioned above, the memory controller may include details related to the error, such as a failing physical address, range of addresses, DIMM, or any other such information related to the specific error that may have occurred. This information may be received from the memory controller. In one implementation, the memory controller may include the information in a data structure, and then signal the processor with an interrupt to read the data structure.

In block 540, at least one process the error may be associated with may be determined. As mentioned above, the memory controller may indicate an error has occurred, but may have no idea which process is associated with the store instruction that caused the error. In block 540, the associating may be determined. For example, given a failing physical address, or range of physical addresses, it may be determined which processes currently have those physical addresses mapped into their virtual address space. In the case of a failing DIMM, it may be determined which processes have portions of their address space mapped to addresses stored on the failing DIMM.

In block 560, at least one of the at least one processes may be notified. In other words, once it is determined which process(es) are associated with the error, one or more of the processes may be notified. As explained above, the process that caused the error may be waiting in the asynchronous notification path for a signal indicating that it was the cause of the error. Once it is determined which process caused the error, such a signal can be sent to the process.

We claim:

1. A method comprising:
   initiating execution of a first process by a processor, wherein the first process causes a memory controller to store a first value associated with the first process in a memory;
   upon initiating the execution of the first process, triggering a synchronous error check process and an asynchronous error check process, wherein the synchronous error check process comprises:
      proactively accessing an error counter to determine a current value;
      determining that the first value was written to the memory;
      proactively accessing the error counter to determine an updated value; and
      when the current value and the updated value are different, indicating that a first error occurred in writing to the memory; and
   wherein the asynchronous error check process comprises:
      waiting for an operating system signal to identify whether the memory controller successfully stored the first value associated with the first process in the memory or a second error occurred; and
      when the operating system signal identifies that the memory controller did not successfully store the first value associated with the first process in the memory and the second error occurred, determining that incrementing the error counter during the synchronous error check process was caused by the first process.

2. The method of claim 1, wherein the operating system signal is an interrupt signal.

3. The method of claim 1, further comprising:
   initiating a corrective action in response to the identification that the memory controller did not successfully store the first value associated with the first process in the memory and the second error occurred.

4. The method of claim 3, wherein the corrective action includes initiating a second execution of the first process.

5. The method of claim 3, wherein the corrective action includes mirroring data between two sections of the memory.

6. The method of claim 3, wherein the corrective action includes transmitting a notification that the first error was caused by the first process.

7. The method of claim 1, wherein the memory controller is configured to increment the error counter when the first error occurs in writing to the memory.

8. The method of claim 1, wherein when the first error occurred and the second error occurred, the method further comprises determining that a Dual In-Line Memory Module (DIMM) failed.

9. A non-transitory processor readable medium containing a set of instructions which, when executed by a processor, cause the processor to:
   initiate execution of a first process by a processor, wherein the first process causes a memory controller to store a first value associated with the first process in a memory;
   upon initiating the execution of the first process, trigger a synchronous error check process and an asynchronous error check process, wherein the synchronous error check process comprises:
      proactively accessing an error counter to determine a current value;

determining that the first value was written to the memory;
proactively accessing the error counter to determine an updated value; and
when the current value and the updated value are different, indicating that a first error occurred in writing to the memory; and
wherein the asynchronous error check process comprises:
waiting for an operating system signal to identify whether the memory controller successfully stored the first value associated with the first process in the memory or a second error occurred; and
when the operating system signal identifies that the memory controller did not successfully store the first value associated with the first process in the memory and the second error occurred, determining that incrementing the error counter during the synchronous error check process was caused by the first process.

10. The non-transitory processor readable medium of claim 9, wherein the processor is further configured:
map the error counter to an address space of the first process.

11. The non-transitory processor readable medium of claim 9, wherein the processor is further configured to:
obtain details related to the first error.

12. The non-transitory processor readable medium of claim 11, wherein the obtained details related to the first error include a physical address in the memory and the processor is further configured to:
determine a process whose virtual address space maps to the physical address; and
transmit a notification to the process.

13. The medium of claim 11 wherein the obtained details related to the first error include:
an indication of a failed memory device.

14. The medium of claim 11 wherein the obtained details related to the first error include:
a range of addresses in which the first error occurred.

15. A system comprising:
a memory;
a memory controller to provide an error counter, the error counter changing when an error occurs in writing a value to the memory; and
a processor to execute instructions to:
initiate execution of a first process, wherein the first process causes the memory controller to store a first value associated with the first process in the memory;
upon initiating the execution of the first process, trigger a synchronous error check process and an asynchronous error check process, wherein the synchronous error check process comprises:
proactively accessing the error counter to determine a current value;
determining that the first value was written to the memory;
proactively accessing the error counter to determine an updated value; and
when the current value and the updated value are different, indicating that a first error occurred in writing to the memory; and
wherein the asynchronous error check process comprises:
waiting for an operating system signal to identify whether the memory controller successfully stored the first value associated with the first process in the memory or a second error occurred; and
when the operating system signal identifies that the memory controller did not successfully store the first value associated with the first process in the memory and the second error occurred, determining that incrementing the error counter during the synchronous error check process was caused by the first process.

* * * * *